(12) United States Patent
Kobaru

(10) Patent No.: US 8,000,939 B2
(45) Date of Patent: Aug. 16, 2011

(54) CHARGED PARTICLE BEAM APPARATUS

(75) Inventor: Atsushi Kobaru, Hitachinaka (JP)

(73) Assignee: Hitachi High-Technologies Corporation, Tokyo (JP)

(*) Notice: Subject to any disclaimer, the term of this patent is extended or adjusted under 35 U.S.C. 154(b) by 688 days.

(21) Appl. No.: 12/021,619

(22) Filed: Jan. 29, 2008

(65) Prior Publication Data

US 2008/0215260 A1    Sep. 4, 2008

(30) Foreign Application Priority Data

Jan. 30, 2007    (JP) .................................. 2007-019489

(51) Int. Cl.
 *H03F 1/26* (2006.01)
(52) U.S. Cl. ........................................ 702/189; 250/310
(58) Field of Classification Search .................. 702/189, 702/198, 199; 250/310, 311; 356/337–340, 356/342
See application file for complete search history.

(56) References Cited

U.S. PATENT DOCUMENTS

| | | | | |
|---|---|---|---|---|
| 5,929,439 A | * | 7/1999 | Todokoro et al. | 250/310 |
| 7,283,659 B1 | * | 10/2007 | Bakker et al. | 382/149 |

FOREIGN PATENT DOCUMENTS

| | | |
|---|---|---|
| JP | 9-330679 A | 12/1997 |
| JP | 2000-182556 A | 6/2000 |

* cited by examiner

*Primary Examiner* — Manuel L Barbee
(74) *Attorney, Agent, or Firm* — Crowell & Moring LLP

(57) ABSTRACT

An object of the present invention is to provide a synthesized signal forming method and an apparatus thereof for realizing both noise reduction and dosage reduction when synthesizing signals detected based on scans performed on a charged particle beam. In order to achieve the above object, with a method that synthesizes signals detected based on a plurality of scans performed on a charged particle beam to form a synthesized signal, a multiplication is performed among a plurality of signals obtained by the plurality of scans and, at the same time, for a multiplied signal, a calculation is performed in which an inverse of the number of previous scans is used as an exponent.

13 Claims, 10 Drawing Sheets

$$w(x,y,frame) = \left[\frac{1}{N}\sum_{frame}\{v(x,y,frame) \times h(x,y,frame)\}\right]^{\frac{1}{2}} \times K1 + AverageN \times K2$$

(a) TOP VIEW (b) SIDE VIEW

FIG. 11

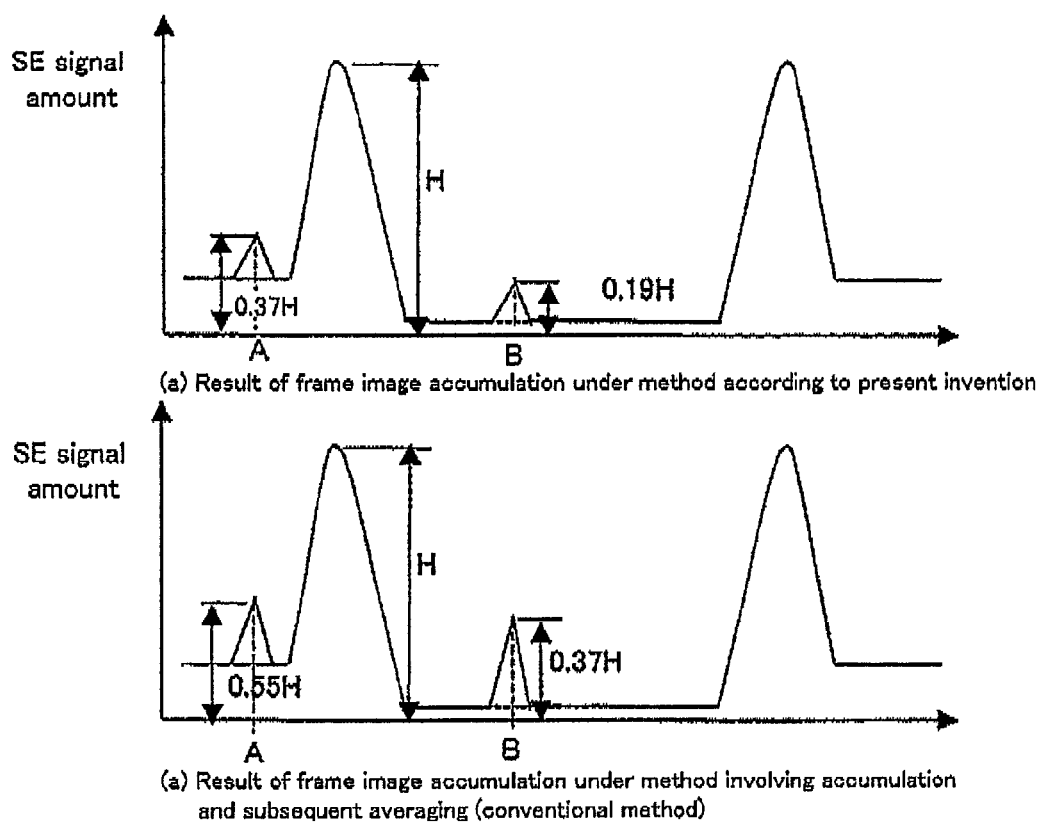

(a) Result of frame image accumulation under method according to present invention (a) Result of frame image accumulation under method involving accumulation and subsequent averaging (conventional method)

Advantage of present invention
a) Noise at position A
$(0.7H+0.2H) \div 2 = 0.45H$
$(0.7H \times 0.2H)^{0.5} = 0.374H$
b) Noise at position B
$(0.7H+0.05H) \div 2 = 0.375H$
$(0.7H \times 0.05H)^{0.5} = 0.19H$
c) Position Having No Noise
$(0.2H+0.2H) \div 2 = 0.2H$
$(0.2H \times 0.2H)^{0.5} = 0.2H$

CHARGED PARTICLE BEAM APPARATUS

BACKGROUND OF THE INVENTION

1. Field of the Invention

The present invention relates to a charged particle beam apparatus that irradiates a charged particle beam on a sample to be observed and performs an observation or a measurement of the shape, material or the like of the sample using physical phenomena such as secondary electron generation or the like resulting from the irradiation, and more particularly, to a charged particle beam apparatus that synthesizes signals obtained by a plurality of scans to form a synthesized signal.

2. Background Art

When an electron beam is accelerated and irradiated on a sample in a vacuum, depending on the surface condition of the sample, secondary electrons (SE) or backscattered electrons (BSE) are emitted from the sample surface. A scanning electron microscope (SEM) uses a phenomenon wherein an emission of secondary electrons or the like varies depending strongly on the shape or the like of the sample, and performs imaging of the surface shape of the sample. The electron beam irradiated at this point is focused using an electron lens so that a focus position coincides with the sample surface.

A configuration such as described above enables irregularities on the sample to be captured as a clear image. With such a scanning electron microscope, the generation efficiency of secondary electrons is very poor and there is a possibility that the scanning electron microscope will be strongly affected by extremely irregular noise such as white noise. Therefore, there are cases where a single scan within an imaging area is unable to produce sufficient signal amount and only images with extremely poor S/N ratios are obtained.

Patent Document 1 and Patent Document 2 describe techniques for suppressing the influence of noise such as described above by scanning the same imaging area a plurality of times and averaging signals obtained as scanning results. Performing averaging enables irregularly generated noise to be suppressed to a certain degree. In addition, Patent Document 2 describes a technique for controlling noise reduction effects by appropriately adjusting the signal intensity of images to be accumulated.

In the description of the present specification, image signals corresponding to an entire imaging area obtained in each single scan may occasionally be referred to as one frame, an average image signal over two scans as a two-frame image, an average image signal over four scans as a four-frame image, and so on.

[Patent Document 1] JP Patent Publication (Kokai) No. 9-330679 A (1997) (corresponding to U.S. Pat. No. 5,929,439)

[Patent Document 2] JP Patent Publication (Kokai) No. 2000-182556 A

SUMMARY OF THE INVENTION

In recent years, with the miniaturization of semiconductor devices and the like, measurement and examination of fine patterns by an electron microscope have become important. For example, with length measurement of patterns or the like by a scanning electron microscope, in some cases, a 32-frame image or a 16-frame image is used in consideration of the image quality of an obtained image and length measurement repeatability.

As described earlier, reducing the number of frames increases susceptibility to strong influences of irregular noise that causes image quality deterioration. In addition, length measurement that is repeatability obtained when repeatedly performing imaging and pattern size measurement over a plurality of times on the same pattern at exactly the same position will also deteriorate under the influence of irregular noise.

On the other hand, miniaturization of semiconductor devices manufactured through semiconductor fabrication is being increasingly promoted. Under such circumstances, it is considered that scanning electron microscopes used for performing measurements, examinations and the like increasingly require a reduction in the dosage of electron beams (reduction of beam irradiance levels with respect to a given area) in order to decrease the damage inflicted on a sample.

As described above, while a larger number of frames is desirable from the perspectives of image quality of an image, length measurement repeatability or the like, on the other hand, since an increase in the number of frames is proportional to an increase in electron dosage, there is a concern that damages may occur at the sample. For example, when the number of added frames is reduced down to around 16 frames, there are cases where obtaining a predetermined image quality becomes difficult.

Meanwhile, an increase in the number of frames results in an increase in the charge amount on the surface of the sample. In particular, with the imaging of a sample susceptible to surface charging due to electron beam irradiation, drifting of a field of view or image distortion attributable to charging more likely occurs. Additionally, since it is necessary to capture images across a greater number of frames to obtain a single image, there is a problem in that a longer image capture time will be required.

Due to the reasons described above, with a method such as described in Patent Document 1 wherein a plurality of images is averaged, there is a problem in that it is difficult to strike a good balance between improvements in image quality or the like of images and dosage reduction. In addition, while Patent Document 2 gives a description on controlling noise reduction effects by multiplying each frame by an arbitrary coefficient, there is a problem in that determining an appropriate coefficient that varies depending on sample type or apparatus condition is extremely difficult and that finding such a condition is time-consuming.

An object of the present invention is to provide a synthesized signal forming method and an apparatus thereof for realizing both noise reduction and dosage reduction when synthesizing signals detected based on scans performed on a charged particle beam to form a synthesized signal.

According to an aspect of the present invention, in order to achieve the above-described object, a synthesized signal forming method and an apparatus thereof are provided which synthesizes signals detected based on a plurality of scans performed on a charged particle beam to form a synthesized signal, wherein multiplications are performed among a plurality of signals obtained by the plurality of scans and, at the same time, a calculation is performed on the multiplied signal wherein an inverse of the number of multiplications is used as an exponent.

According to the above-described aspect of the present invention, for a plurality of scans, stable synthesized signals may be obtained for portions at which signals are stably detected (e.g., an edge portion or the like), and signals irregularly generated due to noise can be effectively reduced by the above-described calculation. For example, when performing a plurality of scans, since signals whose levels are the same are detected for each of the plurality of scans at portions where signals are stably obtained, even when performing multiplication among a plurality of signals and then performing a calculation using an inverse of the number of scans as an exponent, the calculation result will duplicate the original result. For example, when S denotes a signal, $(S^n)^{1/n}=S$ is true (where n is the number of scans, the number of frames, or the number of multiplications).

Meanwhile, since noise occurs irregularly, the same noise rarely occurs for each of a plurality of scans even at the same portion. For example, when noise occurs only for a particular number of scans, applying the calculating equation presented above results in $(Sh \times S^n)^{1/n}$ (where Sh is the signal at the time the noise occurred). When performing such a calculation, it was confirmed that noise could be reduced in various states compared to a case where averaging is performed.

According to such an aspect of the present invention, it is possible to effectively reduce irregularly occurring noise and, at the same time, secure the same signal amount as averaging even for portions where signals are stably obtained.

In addition, in order to solve problems such as those described above, the present invention enables images having sufficient SN ratios to be obtained from images having a small number of frames, i.e., 16 frames or less, by comprising: calculating means that calculates image signals included in a plurality of frames arbitrarily selected for each pixel across the frames; normalizing means that replaces a calculation result by a proportional value whose maximum value is 1 and minimum value is 0; means for multiplying an image signal included in an arbitrary frame by the proportional value for each pixel; means for retaining a result of the multiplication as an image signal of the frame; means for ultimately accumulating results obtained by the multiplying means for all frames for each pixel; and by displaying or storing a result of the accumulation as an image signal.

According to the above-described aspect of the present invention, it is possible to provide a synthesized signal forming method and an apparatus thereof for realizing both noise reduction and dosage reduction when forming a synthesized signal. Other configurations and specific embodiments of the present invention will be disclosed in the detailed description of the preferred embodiments.

BRIEF DESCRIPTION OF THE DRAWINGS

FIG. 11 is a diagram for describing an advantage of an embodiment according to the present embodiment.

DETAILED DESCRIPTION OF THE PREFERRED EMBODIMENTS

Specific configurations of the present invention will now be exemplified with reference to the drawings.

Figure 1:
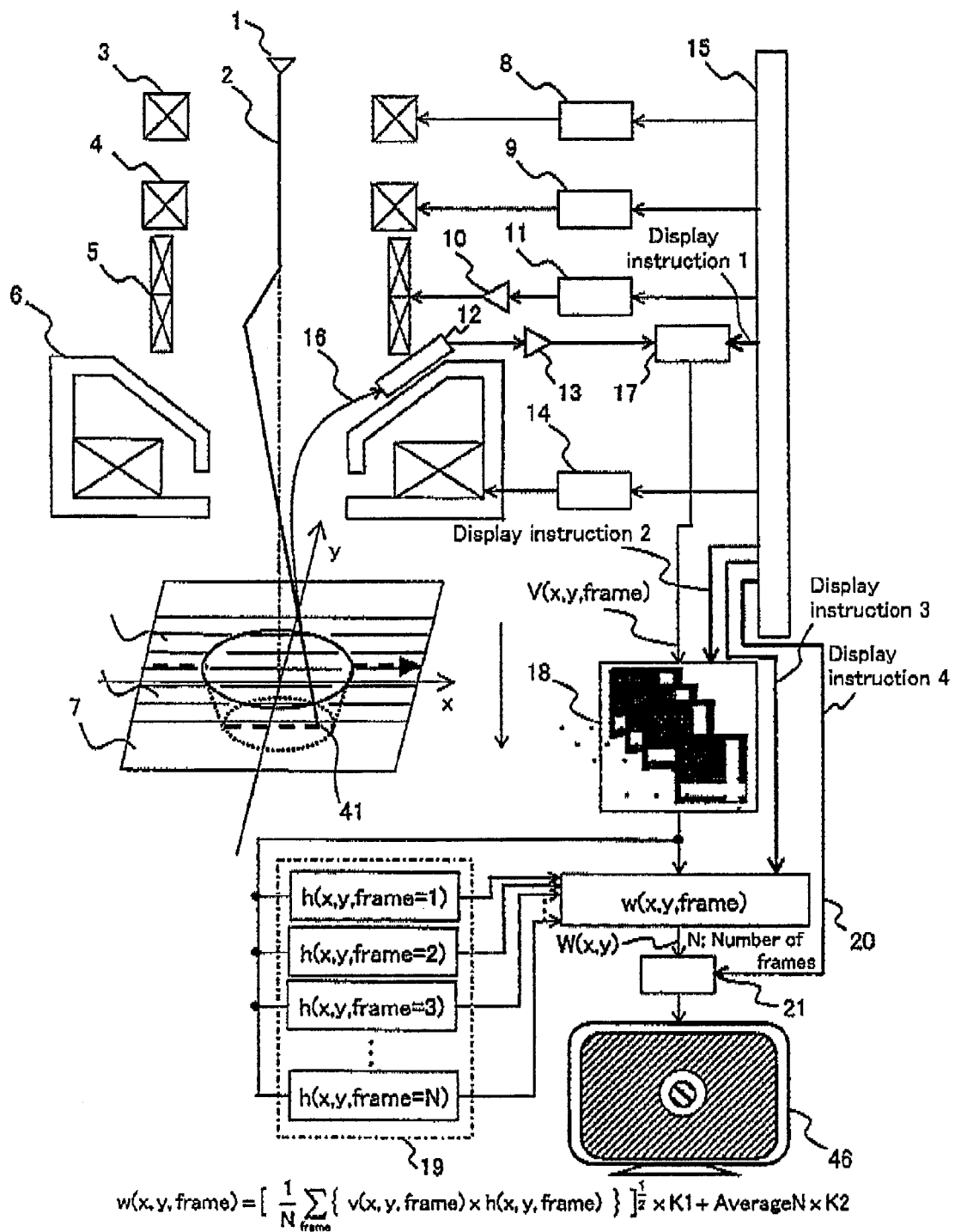
FIG. 1 is a diagram for describing an outline of a scanning electron microscope.

FIG. 1 is a diagram for describing an outline of a scanning electron microscope. While the following description will be given on an example of a scanning electron microscope that is an example of a charged particle beam apparatus, the present invention is not limited to this example and may also be applied to other charged particle beam apparatuses such as an ion beam apparatus or the like which synthesizes secondary signals of an image or the like to form a synthesized signal.

The scanning electron microscope depicted in FIG. 1 comprises: an electron beam source 1; a first convergence lens 3 and a second convergence lens 4 which focus a primary electron beam 2 emitted from the electron beam source 1; a deflector 5 that applies deflection for scanning the primary electron beam 2 on a sample surface 7; and an objective lens 6 that causes the primary electron beam 2 to make a focal point on the sample surface 7.

The scanning electron microscope further comprises: a secondary electron detector 12 that detects a secondary electron 16 generated after the primary electron beam 2 collides with the sample surface 7; a first convergence lens power source 8 and a second convergence lens power source 9 which drive the first convergence lens 3 and the second convergence lens 4; a deflection signal generator 11 that generates a deflection signal so as to cause the primary electron beam 2 to be scanned on the sample surface 7 by a predetermined method; a deflector driver 10 that receives the deflection signal and drives the deflector 5; an amplifier 13 that amplifies the secondary electron signal detected by the secondary electron detector 12; a frame image constructing apparatus 17 that generates an image for each frame from the amplified secondary electron signal; an objective lens power source 14 that drives the objective lens 6 so as to cause the primary electron beam 2 to make a focal point at a predetermined position; and a controller 15 that controls all of the above-described components.

In this case, a frame image V (x, y, frame) generated by the frame image constructing apparatus 17 is first stored per frame in a frame image storage apparatus 18 and then sent to a calculating unit 19 and a pixel-multiplying unit 20. The calculating unit 19 determines per-pixel calculation results based on a calculating equation h (x, y, frame) determined in advance for each frame image sent, and temporarily stores the results thereof.

Meanwhile, the pixel-multiplying unit 20 determines on a per-pixel basis a product of a sent frame image V (x, y, frame) and the calculation result h (x, y, frame) obtained by the calculating unit 19, and after performing accumulations of frame image V (x, y, frame)×h (x, y, frame) for a desired number of accumulations, performs division by the number of accumulations N. An SEM image to be ultimately displayed and measured is obtained by multiplying the result thereof by a coefficient K1 and then adding thereto an averaging result of frame images V (x, y, frame) multiplied by a coefficient K2. The flow initiated when obtaining a frame image V (x, y, frame) and culminating upon obtaining an ultimate SEM image is performed according to display instructions 1 to 4 outputted from the controller 15 in a timely manner.

Detailed operations up to obtaining an ultimate SEM image including the deflection signal generator 11 and the frame image constructing apparatus 17 will now be described with reference to FIG. 2. First, the deflection signal generator 11 outputs an address indicating a position on the sample 7 where an electron beam is to be irradiated from a write address generating circuit 32 according to a clock outputted from a write clock output circuit 31. Based on the address, analog signals corresponding to an amount by which the primary electron 2 is to be deflected are generated from a D/A converter 33 for a horizontal direction and a perpendicular position respectively.

The deflector driver 10 drives the deflector 5 according to the analog signal. Meanwhile, the frame image constructing apparatus 17 operates as described below. That is, a secondary electron signal detected by the secondary electron detector 16 is amplified by the amplifier 13 and then converted into a digital signal by an A/D converter 34.

The digital signal is stored in a memory group within an image memory 36 indicated by an input switch 35. The memory group selected at this point has a one-on-one relationship with a line indicated by an address generated by the write address generating circuit (MW1) 32. At this point, a deflection position of a primary electron beam generated by the write address generating circuit (MW1) 32 is controlled according to a deflection pattern A shown in FIG. 5. Therefore, image data of each single line sent to the image memory is sequentially aligned from top to bottom in an observed area on the sample in a perpendicular direction (perpendicular to a line).

The input switch 35 successively stores the image data so that the image data sequentially aligns in order from top to bottom in a perpendicular direction. Note that with the electron microscope according to the present invention, the deflection pattern to be applied is not limited to that shown in FIG. 5. Even when another deflection pattern is used, obtained image data is aligned in the image memory 36 according to a deflection pattern applied at that point through exactly the same mechanism as described above.

After capturing an image corresponding to a predetermined area on the sample 7 by repeating such a procedure, the image is first stored per frame in the frame image storage apparatus 18 that is actually integrated with the image memory 36, and is read therefrom as required. A frame image read by an output switch 37 from a memory group in the image memory 36 indicated by a read address generating circuit (MR1) 47 is sent to the calculating unit 19 and the pixel-multiplying unit 20.

The calculating unit 19 obtains per-pixel calculation results based on a calculating equation h (x, y, frame) determined in advance for each frame image sent, and temporarily stores the results. On the other hand, the pixel-multiplying unit 20 determines on a per-pixel basis a product of a sent frame image V (x, y, frame) and the calculation result h (x, y, frame) obtained by the calculating unit 19, and after performing accumulations of frame image V (x, y, frame)×h (x, y, frame) for a desired number of accumulations, performs division by the number of accumulations.

An SEM image to be ultimately displayed and measured is obtained by multiplying the result by a coefficient K1 and then adding thereto an averaging result of frame images V (x, y, frame) multiplied by a coefficient K2. The SEM image obtained here is stored by an input switch 38 in a memory group in an image memory 49 indicated by a write address generating circuit (MW2) 48.

In order to perform calculations by the pixel calculator 20 and storage of results thereof in a smooth manner, the read address generating circuit (MR1) 47 and the write address generating circuit (MW2) 48 are synchronized and operated by a calculating clock output circuit 39. An SEM image ultimately obtained though the procedure described above is displayed according to the following procedure.

That is, an address indicating a drawing position on a display 46 is outputted from a read address generating circuit (MR2) 41 according to a clock outputted from a read clock output circuit 40. Based on the address, analog signals corresponding to an amount by which a drawing electron beam to be generated in the display 46 are generated from the D/A converter 42 for a horizontal direction and a perpendicular position respectively. A deflector driver 43 drives a deflector in the display 46 according to the analog signals.

At this point, the frame image constructing apparatus 21 operates as described below. That is, in a state where image data is already accumulated in the image memory 49, a single line's worth of image data is read as a digital signal from a memory group in the image memory 49 indicated by the output switch 44.

The memory group selected at this point has a one-on-one relationship with a line indicated by an address generated by the read address generating circuit (MR2) 41. The read digital signal is converted into an analog signal by a D/A converter 45 and supplied to the display 46. In the display 46, the luminance of the drawing electron beam generated from the cathode is varied according to the analog signal, whereby an image is displayed by deflecting the drawing electron beam by the aforementioned deflector in the display 46. Here, the drawing position on the display 46 generated by the read address generating circuit (MR2) 41 is also controlled according to the deflection pattern A shown in FIG. 5.

Therefore, image data of each single line outputted from the image memory is sequentially aligned from top to bottom in an observed area on the sample in a perpendicular direction (perpendicular to a line). The output switch 44 sequentially sends the image data to the display 46 also according to the deflection pattern A. A scanning electron microscope image of a sample is displayed through such processes. In addition, separate from the main image, image data accumulated in the image memory 49 is sent to the controller 15 where a predetermined objective is achieved after performing necessary image processing.

Figure 5:
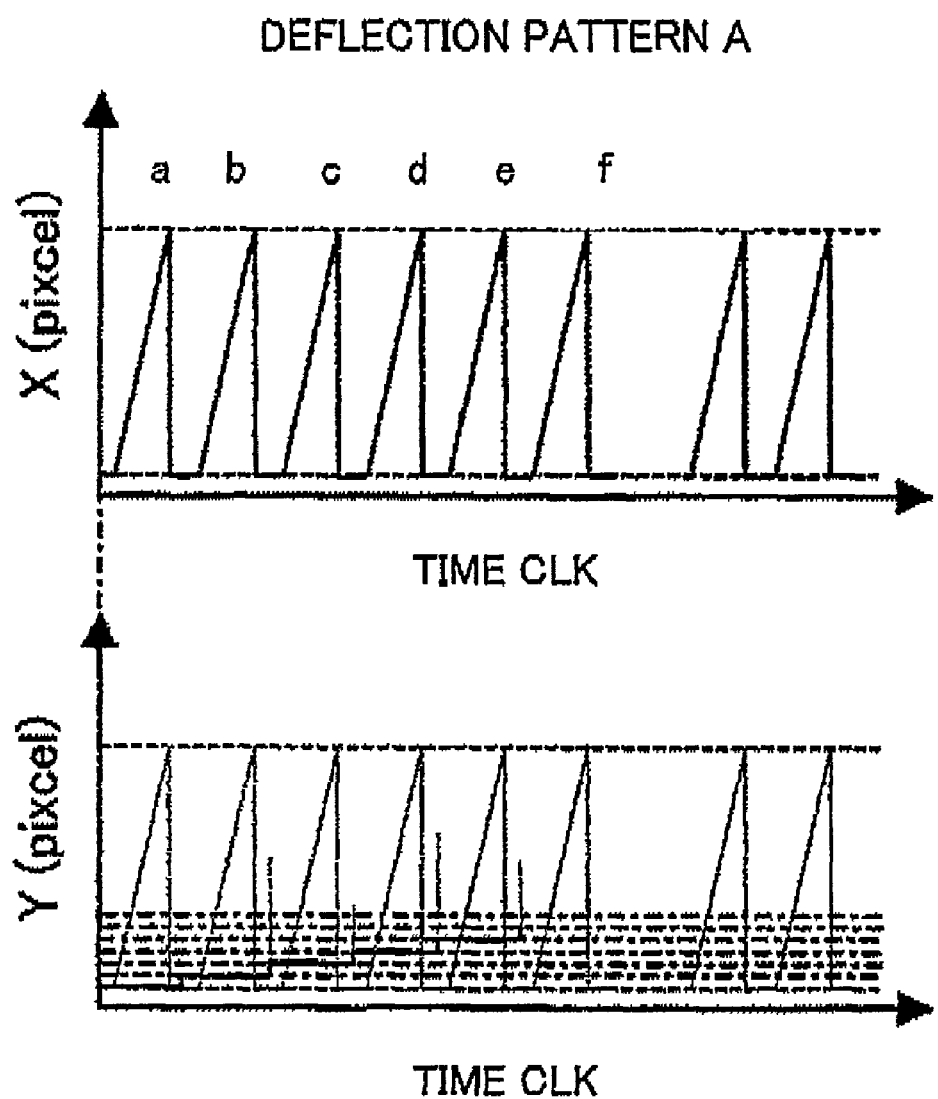
FIG. 5 is a diagram for describing a deflection pattern of a scanning deflector.

With the electron microscope according to the present invention, in a similar manner to the deflection position of the primary electron beam generated by the write address generating circuit (MW1) 32, the deflection pattern to be applied is not limited to that shown in FIG. 5.

Figure 2:
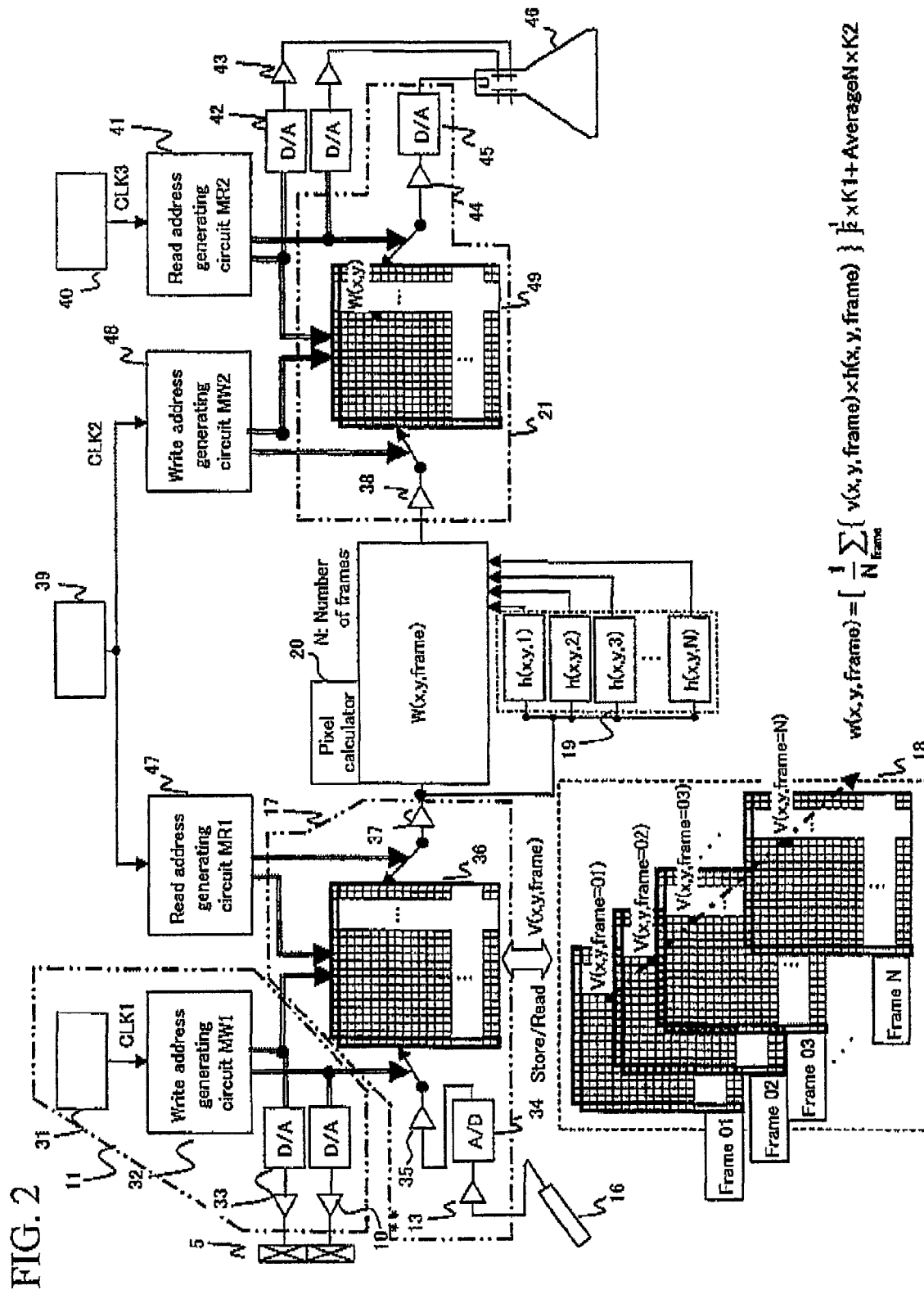
FIG. 2 is a diagram for describing details of an deflection signal generator and an image constructing apparatus.
Figure 3:
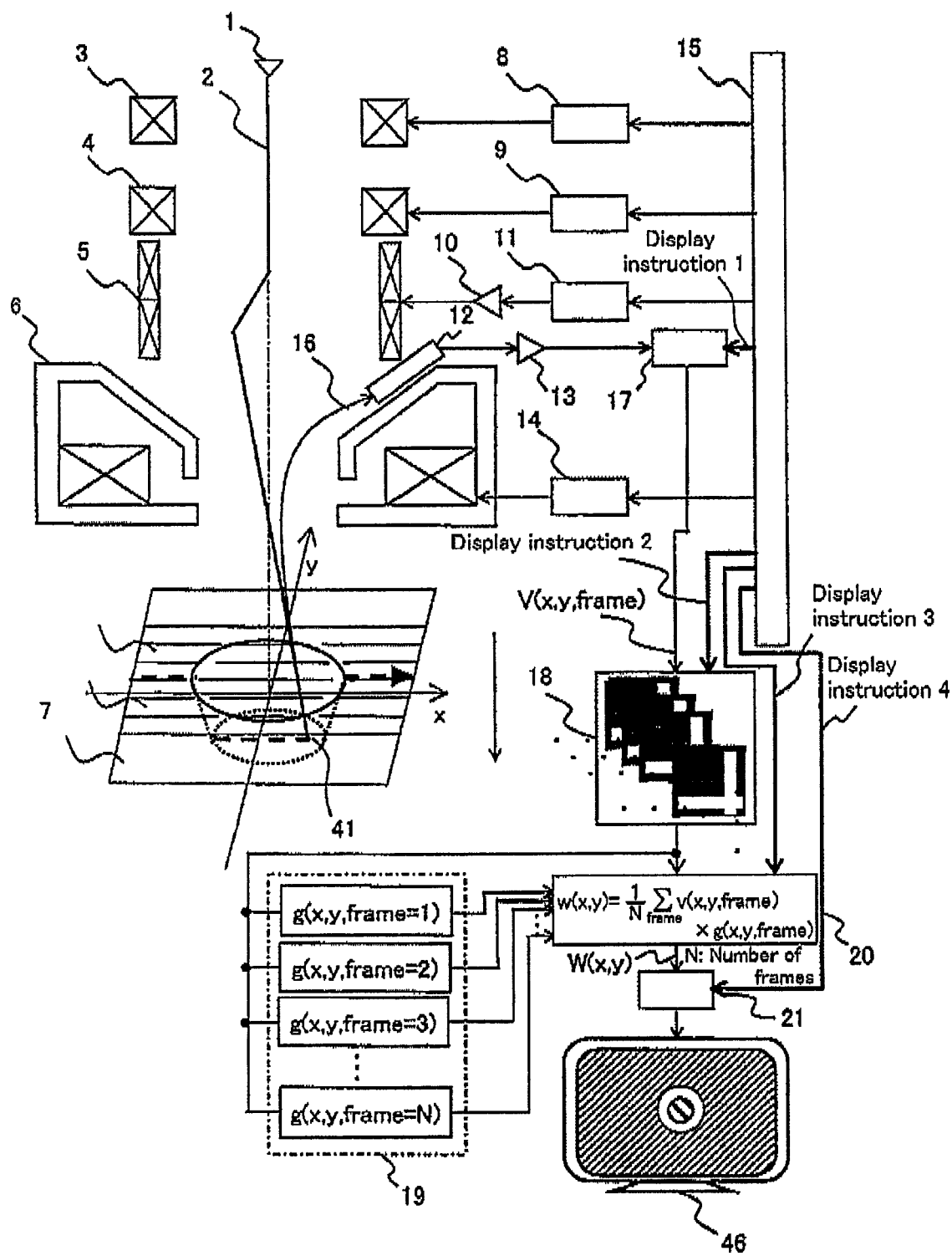
FIG. 3 is a diagram for describing an outline of a scanning electron microscope.
Figure 4:
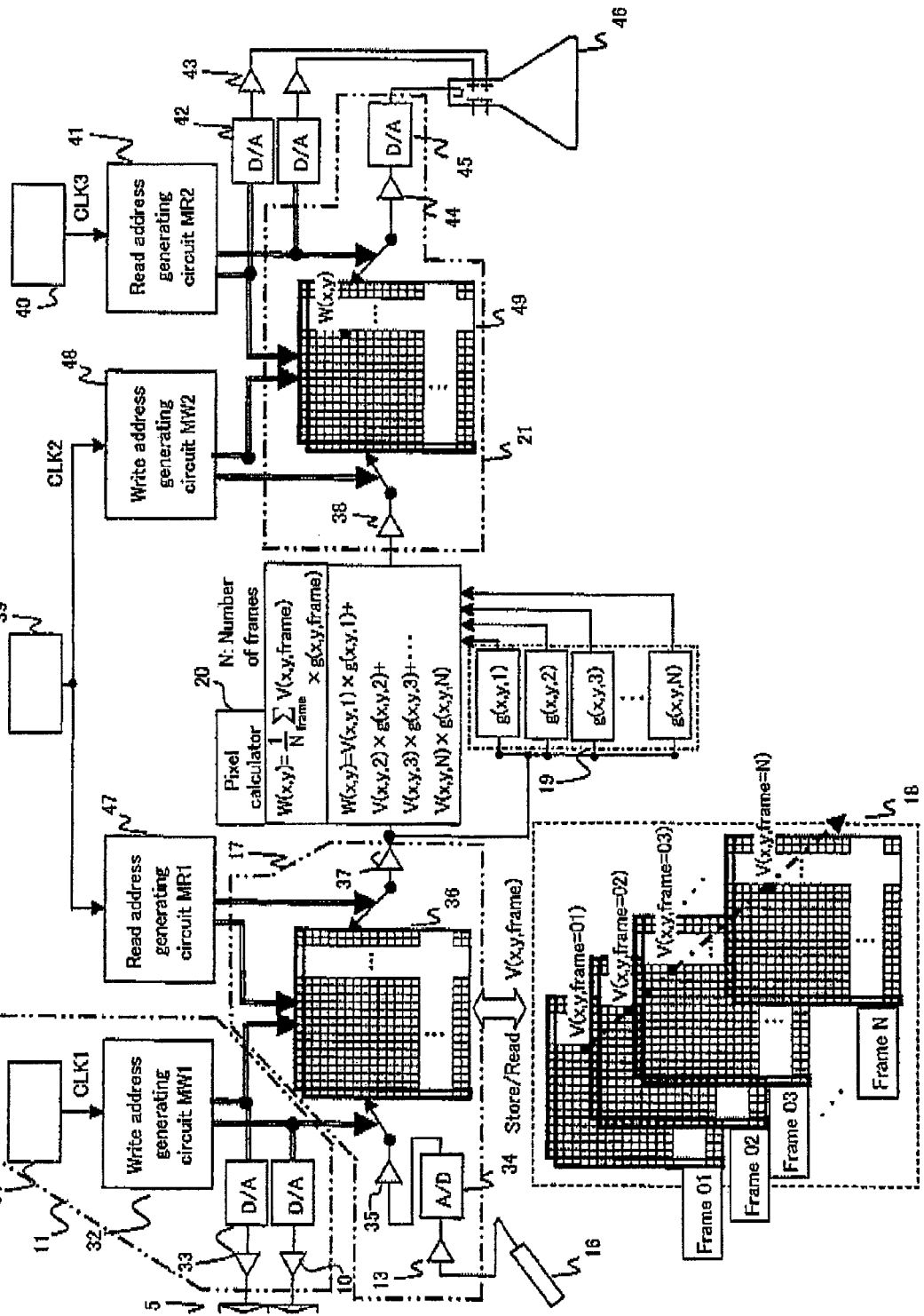
FIG. 4 is a diagram for describing details of an deflection signal generator and an image constructing apparatus.
Figure 6:
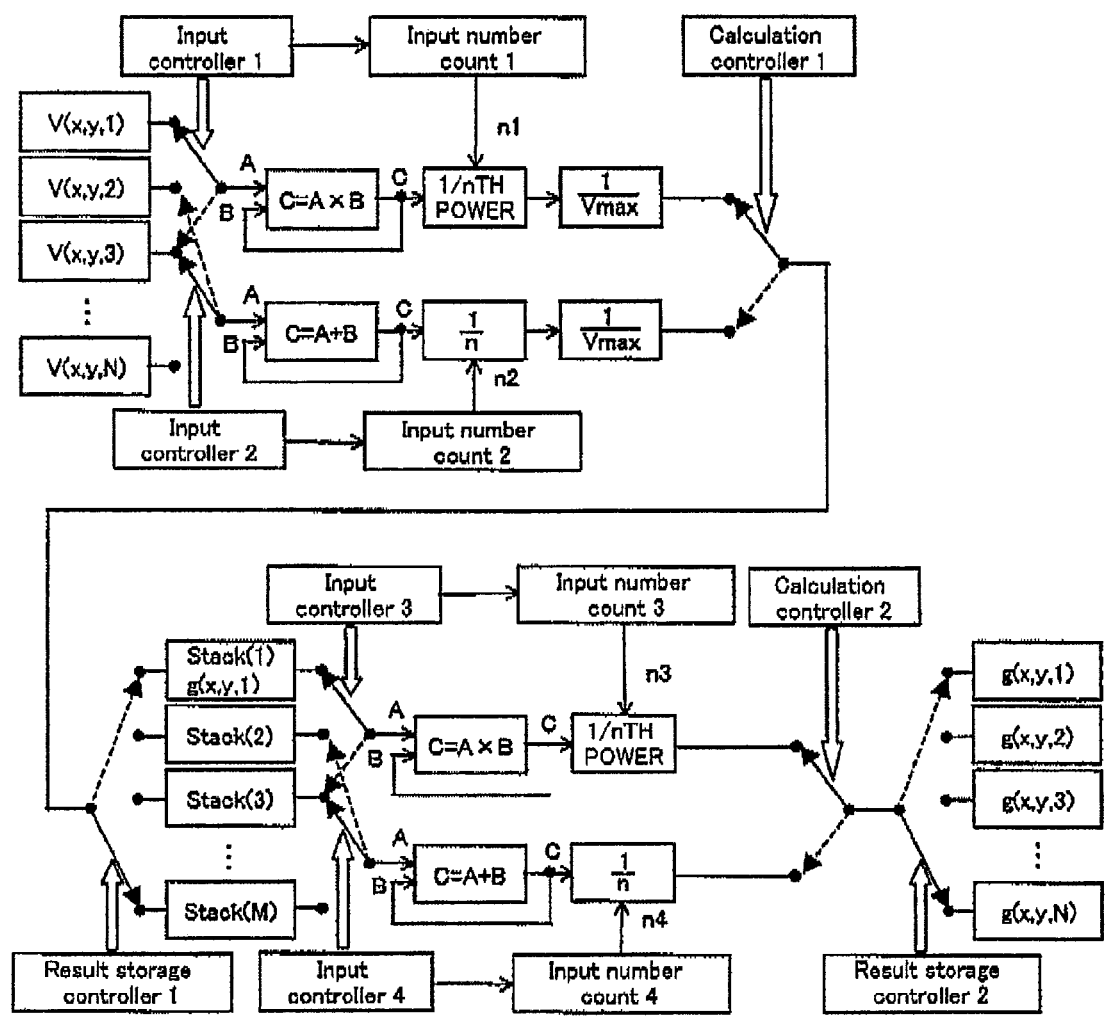
FIG. 6 is a diagram for describing steps of calculation performed by a calculating unit.

An embodiment other than that shown in FIGS. 1 and 2 is shown in FIGS. 3 and 4. While operations are almost the same, the calculating equation h (x, y, frame) has been replaced with g (x, y, frame). FIG. 6 shows a mechanism for generating the calculating equation g (x, y, frame) (the calculating equation h (x, y, frame) is generated in the same manner) to be used by the calculating unit 19. That is, a frame image V (x, y, frame) is sequentially selected and inputted to a calculator C=A×B or C=A+B by an input controller 1 or 2.

In this case, after repeating a predetermined number n1 or n2 of calculations, an 1/n1th power of the output from the calculator C=A×B is found and then divided by a signal maximum value Vmax. Meanwhile, 1/n2 of the output from the calculator C=A+B is determined and then divided by the signal maximum value Vmax. The results thereof are temporarily stored in Stacks (1) to (M) and are used in calculations performed in the subsequent stage.

In the calculations in the subsequent stage, sequential selection and input to the calculator C=A×B or C=A+B is performed in the same manner. At this point, after repeating a predetermined number n3 or n4 of calculations, an 1/n3th power of the output from the calculator C=A×B is found. Meanwhile, 1/n4 of the output from the calculator C=A+B is determined. The results thereof are temporarily stored in g (x, y, frame) that forms a pair with the frame image currently being calculated. In this manner, a synthesized signal is formed. While the synthesis of a two-dimensional signal such as image information will be described for the present embodiment, the method is not limited to this example and may also be used when synthesizing one-dimensional information such as a line profile.

Examples of calculating equations determined in this manner are presented as calculating equation examples 1 to 6.

[Formula 1]

Calculating equation example 1

$h(x, y, 1) =$
$\{V(x, y, 1) \times V(x, y, 2) \times V(x, y, 3) \times V(x, y, 4) \ldots \times V(x, y, N)\}^{\frac{1}{N}}$ $h(x, y, 2) =$
$\{V(x, y, 1) \times V(x, y, 2) \times V(x, y, 3) \times V(x, y, 4) \ldots \times V(x, y, N)\}^{\frac{1}{N}}$ $h(x, y, 3) =$
$\{V(x, y, 1) \times V(x, y, 2) \times V(x, y, 3) \times V(x, y, 4) \ldots \times V(x, y, N)\}^{\frac{1}{N}}$ $h(x, y, N) =$
$\{V(x, y, 1) \times V(x, y, 2) \times V(x, y, 3) \times V(x, y, 4) \ldots \times V(x, y, N)\}^{\frac{1}{N}}$ $AverageN = \{V(x, y, 1) + V(x, y, 2) + V(x, y, 3) + V(x, y, 4) \ldots + V(x, y, N)\} \div N$ $K1 = 0.9, K2 = 0.1 (K1$ and $K2$ are variables such that $K1 + K2 = 1)$.

$$g(x, y, 1) = \frac{[\{V(x, y, 2) + V(x, y, 4) \ldots + V(x, y, N)\} \times \{V(x, y, 1) + V(x, y, 3) \ldots + V(x, y, N-1)\}]^{\frac{1}{2}} \times 2}{N \times V\max}$$

$$g(x, y, 2) = \frac{[\{V(x, y, 2) + V(x, y, 4) \ldots + V(x, y, N)\} \times \{V(x, y, 1) + V(x, y, 3) \ldots + V(x, y, N-1)\}]^{\frac{1}{2}} \times 2}{N \times V\max}$$

$$g(x, y, 3) = \frac{[\{V(x, y, 2) + V(x, y, 4) \ldots + V(x, y, N)\} \times \{V(x, y, 1) + V(x, y, 3) \ldots + V(x, y, N-1)\}]^{\frac{1}{2}} \times 2}{N \times V\max}$$

$\vdots$ $$g(x, y, N) = \frac{[\{V(x, y, 2) + V(x, y, 4) \ldots + V(x, y, N)\} \times \{V(x, y, 1) + V(x, y, 3) \ldots + V(x, y, N-1)\}]^{\frac{1}{2}} \times 2}{N \times V\max}$$

(Note) A case where $N$ is an even number is shown

[Formula 2]

Calculating equation example 2

$$g(x, y, 1) = \frac{\{V(x, y, 2) + V(x, y, 3) + V(x, y, 4) \ldots + V(x, y, N)\}}{(N-1) \times V\max}$$

$$g(x, y, 2) = \frac{\{V(x, y, 1) + V(x, y, 3) + V(x, y, 4) \ldots + V(x, y, N)\}}{(N-1) \times V\max}$$

$$g(x, y, 3) = \frac{\{V(x, y, 1) + V(x, y, 2) + V(x, y, 4) \ldots + V(x, y, N)\}}{(N-1) \times V\max}$$

$\vdots$ $$g(x, y, N) = \frac{\{V(x, y, 1) + V(x, y, 2) + V(x, y, 3) \ldots + V(x, y, N-1)\}}{(N-1) \times V\max}$$

[Formula 3]

Calculating equation example 3

$$g(x, y, 1) = \frac{\{V(x, y, 2) \times V(x, y, 3) \times V(x, y, 4) \ldots \times V(x, y, N)\}^{\frac{1}{(N-1)}}}{V\max}$$

$$g(x, y, 2) = \frac{\{V(x, y, 1) \times V(x, y, 3) \times V(x, y, 4) \ldots \times V(x, y, N)\}^{\frac{1}{(N-1)}}}{V\max}$$

$$g(x, y, 3) = \frac{\{V(x, y, 1) \times V(x, y, 2) \times V(x, y, 4) \ldots \times V(x, y, N)\}^{\frac{1}{(N-1)}}}{V\max}$$

$\vdots$ $$g(x, y, N) = \frac{\{V(x, y, 1) \times V(x, y, 2) \times V(x, y, 3) \ldots \times V(x, y, N-1)\}^{\frac{1}{(N-1)}}}{V\max}$$

[Formula 4]

Calculating equation example 4

$$g(x, y, 1) = \frac{\{V(x, y, 2) + V(x, y, 4) + V(x, y, 6) \ldots + V(x, y, N)\}\} \times 2}{N \times V\max}$$

$$g(x, y, 2) = \frac{\{V(x, y, 1) + V(x, y, 3) + V(x, y, 5) \ldots + V(x, y, N-1)\} \times 2}{N \times V\max}$$

$$g(x, y, 3) = \frac{\{V(x, y, 2) + V(x, y, 4) + V(x, y, 6) \ldots + V(x, y, N)\} \times 2}{N \times V\max}$$

$$\vdots$$

$$g(x, y, N) = \frac{\{V(x, y, 1) + V(x, y, 3) + V(x, y, 5) \ldots + V(x, y, N-1)\} \times 2}{N \times V\max}$$

(*Note*) A case where $N$ is an even number is shown

[Formula 5]

Calculating equation example 5

$$g(x, y, 1) = \frac{\{V(x, y, 2) \times V(x, y, 4) \times V(x, y, 6) \ldots \times Vx, y, N)\}^{\frac{2}{N}}}{V\max}$$

$$g(x, y, 2) = \frac{\{V(x, y, 1) \times V(x, y, 3) \times V(x, y, 5) \ldots \times V(x, y, N-1)\}^{\frac{2}{N}}}{V\max}$$

$$g(x, y, 3) = \frac{\{V(x, y, 2) \times V(x, y, 4) \times V(x, y, 6) \ldots \times V(x, y, N)\}^{\frac{2}{N}}}{V\max}$$

$$\vdots$$

$$g(x, y, N) = \frac{\{V(x, y, 1) \times V(x, y, 3) \times V(x, y, 5) \ldots \times V(x, y, N-1)\}^{\frac{2}{N}}}{V\max}$$

(*Note*) A case where $N$ is an even number is shown

[Formula 6]

Calculating equation example 6

$$g(x, y, 1) = \frac{[\{V(x, y, 2) + V(x, y, 4) \ldots + V(x, y, N)\} \times \{V(x, y, 1) + V(x, y, 3) \ldots + V(x, y, N-1)\} \times \{V(x, y, 1) + V(x, y, 2) \ldots + V(x, y,N)\} \times \{V(x, y,N+1) + V(x, y,N+2) \ldots + V(x, y, N)\}]^{\frac{1}{4}} \times 2}{N \times V\max}$$

$$g(x, y, 2) = \frac{[\{V(x, y, 2) + V(x, y, 4) \ldots + V(x, y, N)\} \times \{V(x, y, 1) + V(x, y, 3) \ldots + V(x, y, N-1)\} \times \{V(x, y, 1) + V(x, y, 2) \ldots + V(x, y,N)\} \times \{V(x, y,N+1) + V(x, y,N+2) \ldots + V(x, y, N)\}]^{\frac{1}{4}} \times 2}{N \times V\max}$$

$$g(x, y, 3) = \frac{[\{V(x, y, 2) + V(x, y, 4) \ldots + V(x, y, N)\} \times \{V(x, y, 1) + V(x, y, 3) \ldots + V(x, y, N-1)\} \times \{V(x, y, 1) + V(x, y, 2) \ldots + V(x, y,N)\} \times \{V(x, y,N+1) + V(x, y,N+2) \ldots + V(x, y, N)\}]^{\frac{1}{4}} \times 2}{N \times V\max}$$

$$\vdots$$

$$g(x, y, N) = \frac{[\{V(x, y, 2) + V(x, y, 4) \ldots + V(x, y, N)\} \times \{V(x, y, 1) + V(x, y, 3) \ldots + V(x, y, N-1)\} \times \{V(x, y, 1) + V(x, y, 2) \ldots + V(x, y,N)\} \times \{V(x, y,N+1) + V(x, y,N+2) \ldots + V(x, y, N)\}]^{\frac{1}{4}} \times 2}{N \times V\max}$$

(*Note*) A case where $N$ is an even number is shown

Advantages of the present invention will be described below.

Figure 7:
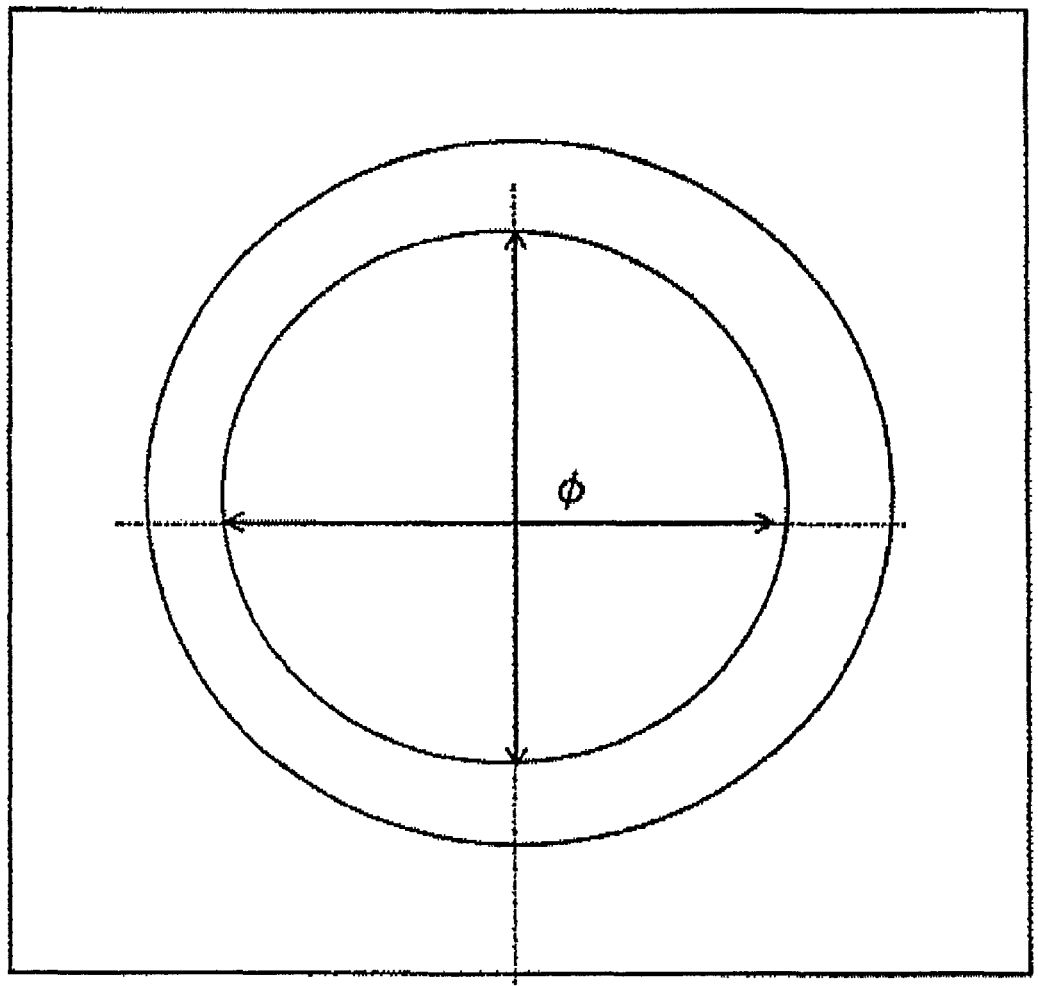
FIG. 7 is a diagram for describing an SEM image of a hole pattern.
Figure 7:
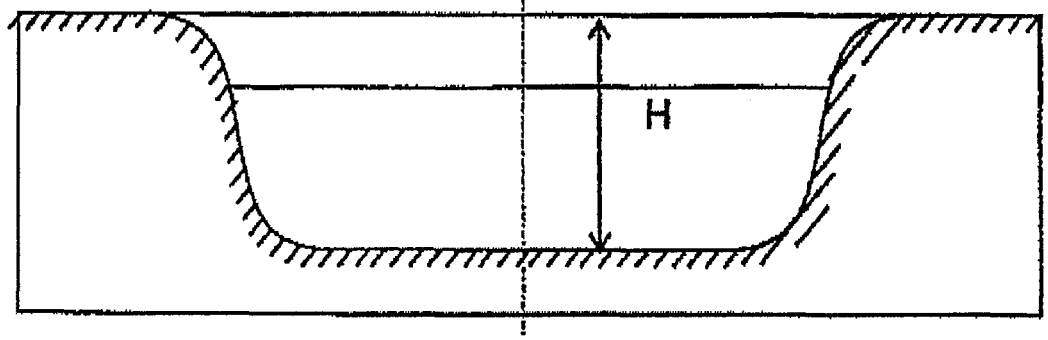
Figure 8:
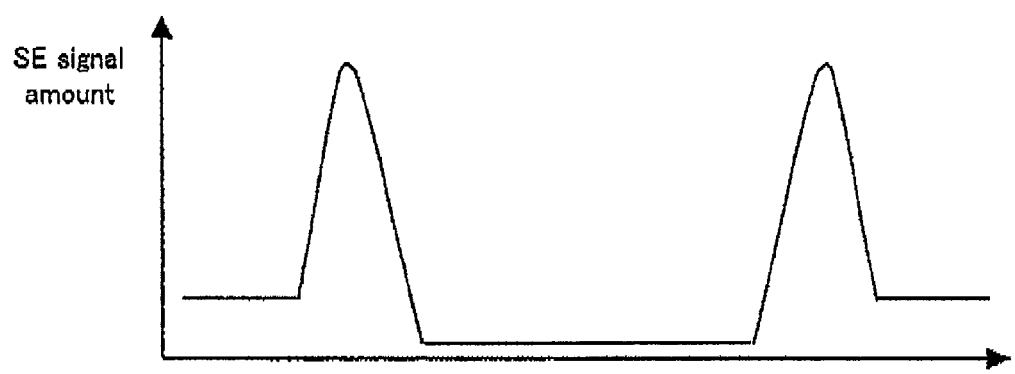
FIG. 8 is a diagram for describing an example of a line profile.
Figure 9:
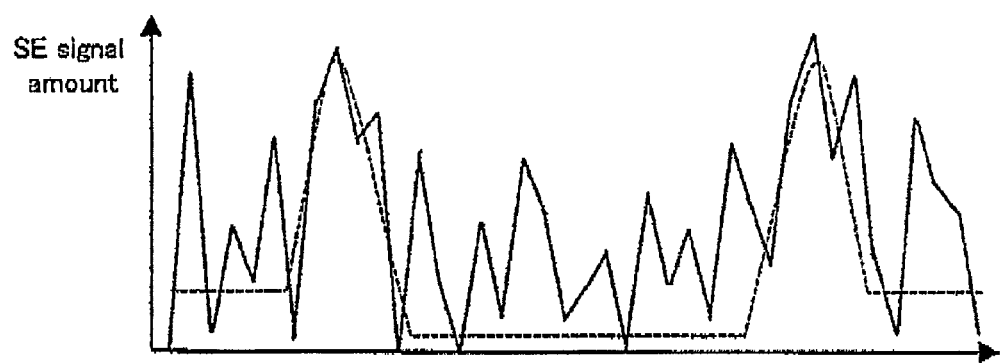
FIG. 9 is a diagram for describing an advantage of an embodiment according to the present embodiment.

When acquiring an SEM image through a hole having an inside diameter φ and a height H as shown in FIG. 7, a signal describing a smooth curve which takes a maximum value at an edge sloped portion, such as shown in FIG. 8, will be ideally obtained. However, since an actual image of a scanning electron microscope is also strongly influenced by white noise, an image of a single frame will be in a state where distinguishing signal portions from noise portions will be difficult, such as shown in FIG. 9.

Figure 10:
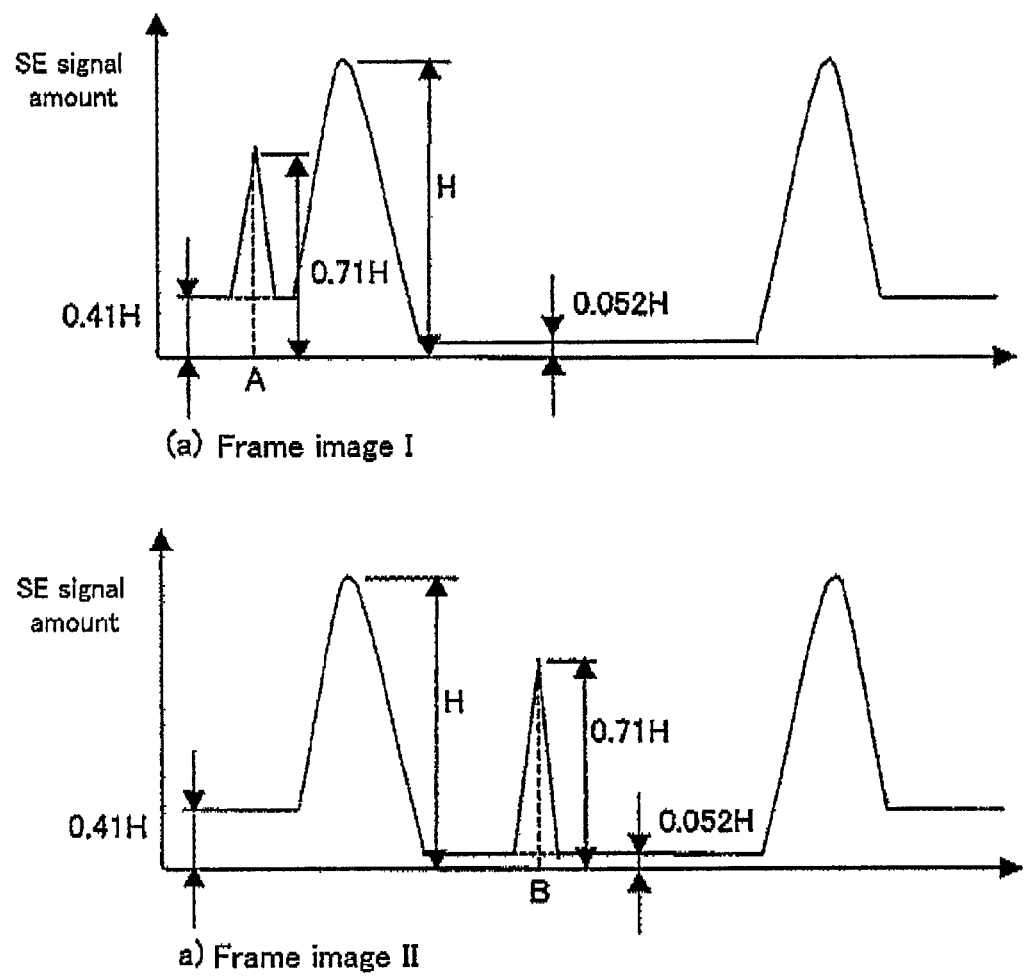
FIG. 10 is a diagram for describing an advantage of an embodiment according to the present embodiment.

For example, as shown in FIG. 10, let us assume that, with respect to an original image signal maximum value H, a frame image I (refer to FIG. 10(a)) having a noise whose height is 0.71 times the height of the original image signal maximum value H (0.71H) at position A and a frame image II (refer to FIG. 10(b)) having a noise whose height is also 0.71 times the height of the original image signal maximum value H (0.71H) at position B. Results of accumulation processing performed thereon under the method according to the present invention are shown in FIG. 11(a), while results of accumulation processing performed thereon under a conventional method involving "accumulating and averaging" are shown in FIG. 11(b).

As is apparent from comparing the results, when performing accumulation processing under the method according to the present invention, the height of the noise at position A is reduced to 0.37 times the height of the original image signal maximum value H (0.37H) and the height of the noise at position B is reduced to 0.19 times the height of the original image signal maximum value H (0.19H). However, with a conventional method involving "accumulating and averaging", it is shown that the height of the noise at position A is reduced to 0.55 times the height of the original image signal maximum value H (0.55H) and the height of the noise at position B is reduced to 0.37 times the height of the original image signal maximum value H (0.37H). On the other hand, with accumulation processing under the method according to the present invention, the image signal maximum value H is completely unaffected by the processing.

Consequently, it is apparent that, by performing accumulation processing under the method according to the present invention, noise can be suppressed by approximately half in comparison to a conventional method. Also, accordingly, by performing accumulation processing under the method of the present invention, it is now possible to approximately double the SN ratio that is a measure of the degree of noise in an image in comparison to a conventional method.

What is claimed is:

1. A synthesized signal forming method that synthesizes signals detected based on a plurality of scans performed on a charged particle beam to form a synthesized signal, the synthesized signal forming method comprising:
   performing, by a processor, a multiplication among a plurality of signals obtained by the plurality of scans to obtain a multiplied signal; and
   performing, by the processor, a calculation in which the multiplied signal is exponentiated by an inverse of the number of multiplications.

2. The synthesized signal forming method according to claim 1, wherein the multiplication is performed for each pixel at the same position across the plurality of signals.

3. A charged particle beam apparatus comprising:
   a charged particle source;
   a scanning deflector that scans a charged particle beam emitted from the charged particle source; and
   a controller that synthesizes signals obtained from a scan performed by the scanning deflector on a per-frame basis, wherein
   the controller performs a multiplication among a plurality of signals obtained by a plurality of scans by the scanning deflector to obtain a multiplied signal, and performs a calculation in which the multiplied signal is exponentiated by an inverse of the number of multiplications.

4. The charged particle beam apparatus according to claim 3, wherein the multiplication is performed for each pixel at the same position across the plurality of signals.

5. An apparatus in a scanning electron microscope, the apparatus comprising:
   a calculator that calculates image signals included in a plurality of frames arbitrarily selected for each pixel across the frames, wherein the calculator performs one or more multiplications;
   a first recalculator that recalculates a calculation result by performing N number of multiplications and exponentiating the result to the (1/N+1)th power;
   a normalizer that replaces the calculation result by a proportional value whose maximum value is 1 and minimum value is 0;
   a multiplier that multiplies an image signal included in an arbitrary frame by the proportional value for each pixel;
   a first memory that retains a result of the multiplication as an image signal of the frame;
   an accumulator that accumulates results obtained by the multiplier for all frames for each pixel; and
   at least one of a display that displays a result of the accumulation as an image signal or a second memory that stores the result of the accumulation as the image signal.

6. The apparatus according to claim 5, wherein an exclusive relationship exists between the plurality of frames used by the calculator and the frame with which the calculation result is multiplied.

7. The apparatus according to claim 6, wherein the calculator performs one or more additions.

8. The apparatus according to claim 6, wherein the calculator performs one or more subtractions.

9. The apparatus according to claim 6, wherein the calculator performs one or more divisions.

10. The apparatus according to claim 5, wherein the calculator performs one or more additions.

11. The apparatus according to claim 5, further comprising a second recalculator that recalculates the calculation result by performing N number of additions and exponentiating the result to the (1/N+1)th power.

12. The apparatus according to claim 5, wherein the calculator performs one or more subtractions.

13. The apparatus according to claim 5, wherein the calculator performs one or more divisions.

* * * * *